(12) United States Patent
Hoegberg et al.

(10) Patent No.: US 10,476,256 B2
(45) Date of Patent: Nov. 12, 2019

(54) GROUND/VOLTAGE OPEN INPUT

(71) Applicant: Hamilton Sundstrand Corporation, Charlotte, NC (US)

(72) Inventors: Lon R. Hoegberg, Belvidere, IL (US); Brennan Fox, Geneseo, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 264 days.

(21) Appl. No.: 15/587,856

(22) Filed: May 5, 2017

(65) Prior Publication Data

US 2018/0323604 A1    Nov. 8, 2018

(51) Int. Cl.
*H02H 3/22* (2006.01)
*H02H 9/04* (2006.01)
*H03K 19/003* (2006.01)
*H03K 19/0175* (2006.01)

(52) U.S. Cl.
CPC ............... *H02H 3/22* (2013.01); *H02H 9/04* (2013.01); *H03K 19/003* (2013.01); *H03K 19/00315* (2013.01); *H03K 19/017509* (2013.01)

(58) Field of Classification Search
CPC .......... H02H 9/04; H02H 3/22; H03K 19/003; H03K 19/00315; H03K 19/017509
USPC ........................................................ 361/56
See application file for complete search history.

(56) References Cited

U.S. PATENT DOCUMENTS

| 3,213,294 | A | 10/1965 | Okuda |
| 6,556,394 | B1 | 4/2003 | Wilson |
| 7,061,734 | B2 | 6/2006 | Zack et al. |
| 7,233,165 | B2 | 6/2007 | Jordy |
| 7,692,474 | B2 | 4/2010 | Stegmayr |
| 9,570,927 | B2 | 2/2017 | Kinzer et al. |
| 2012/0139589 | A1* | 6/2012 | Machida ........... H02M 3/33507 327/109 |
| 2012/0287540 | A1 | 11/2012 | Dobkin et al. |
| 2016/0156179 | A1* | 6/2016 | Walter ................... B60L 50/10 361/91.1 |

FOREIGN PATENT DOCUMENTS

| CN | 102104248 A | 6/2011 |
| CN | 204013450 U | 12/2014 |
| JP | H0468918 A | 3/1992 |

OTHER PUBLICATIONS

Extended European Search Report dated Oct. 9, 2018, issued during the prosecution of European Patent Application No. EP 18170647.4 (8 pages).

* cited by examiner

*Primary Examiner* — Kevin J Comber
(74) *Attorney, Agent, or Firm* — Locke Lord LLP; Scott D. Wofsy; Joshua L. Jones

(57) ABSTRACT

An input circuit includes an input line for providing input regarding state of a load. A first impedance is connected to the input line at a first node for connecting a voltage source to the input line. A second impedance is connected to the input line at a second node for connecting the input line to ground. A Zener diode is connected in the input line in series between the first and second nodes to impede current flowing through the Zener diode below the Zener voltage thereof in a direction from the first node to the second node, and to allow current above the Zener voltage thereof in the direction from the first node to the second node.

13 Claims, 1 Drawing Sheet

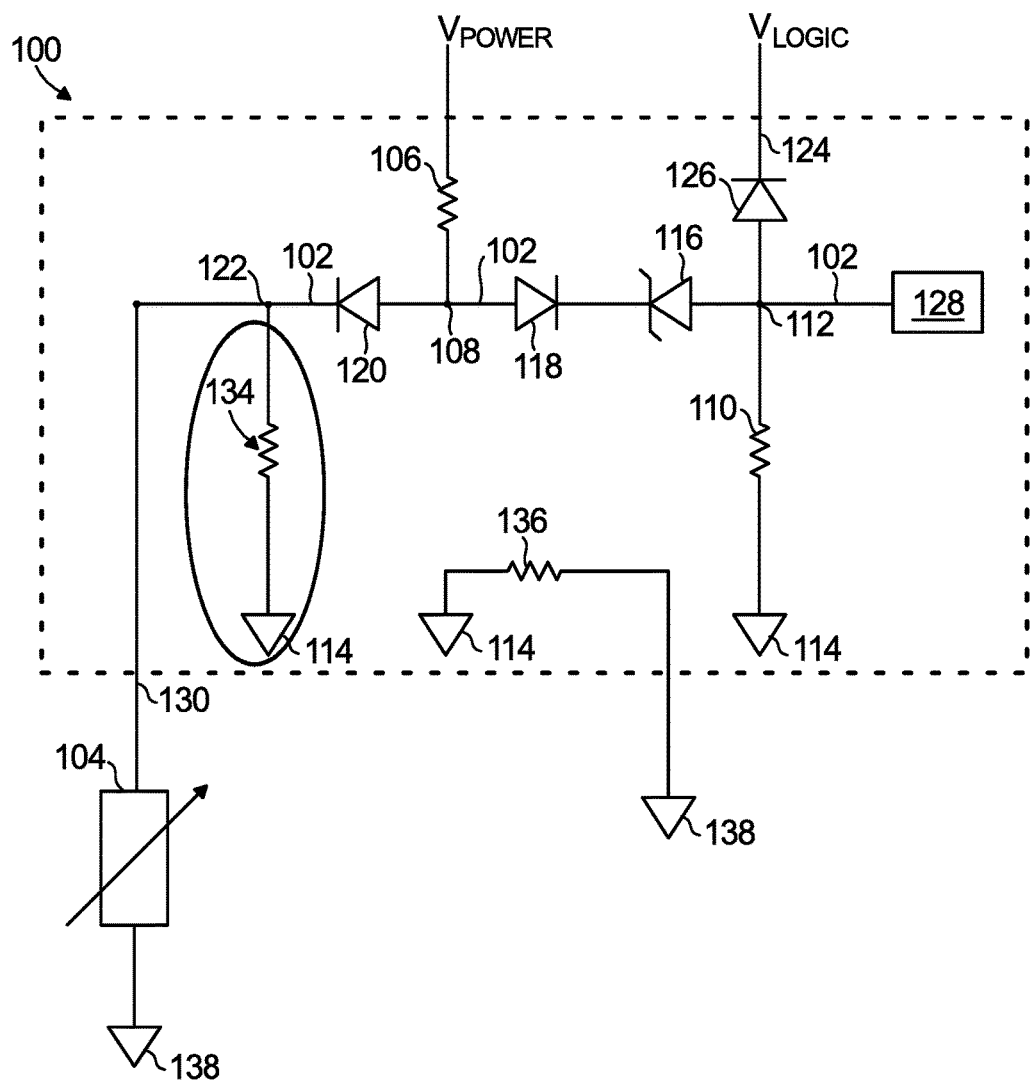

GROUND/VOLTAGE OPEN INPUT

BACKGROUND OF THE INVENTION

1. Field of the Invention

The present disclosure relates to circuits to sense the state of a discrete input, and more particularly to ground open inputs and voltage open inputs.

2. Description of Related Art

Conventional topologies for ground open input sense circuits provide a logic high input to a logic component if a monitored load is grounded and a logic low if the monitored load is not grounded. It is also a requirement that a logic low current to the load be met. The conventional topologies are restricted in operating range when the circuit has a power supply voltage that varies over a wide range. This problem is exacerbated by the voltage thresholds needed by individual logic devices to register a logic high and a logic low. Lightning transients, or the like, also force large resistances to be used in order to protect the circuit from damage. So, a conventional circuit must output a logic low even when the voltage supply is at its maximum with a maximum load resistance. And a conventional circuit must also output a logic high when the voltage supply is at a minimum with a minimum load resistance.

The conventional techniques have been considered satisfactory for their intended purpose. However, there is an ever present need for improved input circuits. This disclosure provides a solution for this problem.

SUMMARY OF THE INVENTION

An input circuit includes an input line for providing input or information regarding state of a load. A first impedance is connected to the input line at a first node for connecting a voltage source to the input line. A second impedance is connected to the input line at a second node for connecting the input line to ground. A Zener diode is connected in the input line in series between the first and second nodes to impede current flowing through the Zener diode below the Zener voltage thereof in a direction from the first node to the second node, and to allow current above the Zener voltage thereof in the direction from the first node to the second node.

A second diode can be connected in the input line in series with the Zener diode between the first and second nodes, wherein the second diode is oriented to impede current flowing in the direction from the second node to the first node for lightning/transient protection. The second diode can be between the first node and the Zener diode. The second diode can be a non-Zener diode. A load diode can be connected on the input line on a side of the first node opposite the second node for protecting the input line from transients from a load connected to an input node of the input line opposite the load diode from the first node. The load diode can be a non-Zener diode.

A clamp line can be connected to the input line at the second node for connecting a voltage outlet for relieving over voltage of a logic device. A clamp line diode can be connected in the clamp line oriented to impede current from the clamp line into the input line to ensure input voltage does not exceed an over voltage limit for a logic device connected to the second node of the input line.

A logic device operatively can be connected to the second node of the input line for receiving voltage or open input as a logic high from the input line and for receiving open, ground, or voltage input as a logic low from the input line. The logic device can have a logic high voltage that is matched to or derived from the Zener voltage of the Zener diode.

A load line can be connected to the input line at an input node on a side of the first node opposite the second node for connecting a load to the input line. A third impedance can be connected to the input line at the input node for providing voltage open input from the input line to a logic device connected to the second node of the input line, wherein the third impedance connects between the input line and ground.

A method of providing input from a load to a logic device includes impeding current through an input line to a logic device with a Zener diode to ensure a logic low is input to the logic device when voltage across the Zener diode is below the Zener voltage of the Zener diode. The method also includes allowing current through the input line to ensure a logic high is input to the logic device when voltage across the Zener diode exceeds the Zener voltage of the Zener diode. The method can include protecting the input line from transients with a diode in the input line oriented to oppose current in a direction from the logic device into the input line. Impeding the current and allowing current can include providing ground open input to the logic device for determining whether a load is grounded or not. It is also contemplated that impeding the current and allowing current can include providing voltage open input to the logic device to determine whether a voltage source is powered on or not.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain FIGURES, wherein:

FIG. 1 is a schematic view of an exemplary embodiment of an input circuit constructed in accordance with the present disclosure, showing the configuration for a ground open input topology and also showing a modification to provide a voltage open topology.

DETAILED DESCRIPTION OF THE PREFERRED EMBODIMENTS

Reference will now be made to the drawings wherein like reference numerals identify similar structural features or aspects of the subject disclosure. For purposes of explanation and illustration, and not limitation, a partial view of an exemplary embodiment of an input circuit in accordance with the disclosure is shown in FIG. 1 and is designated generally by reference character 100. The systems and methods described herein can be used to provide voltage, open, or ground input or voltage open input to logic devices.

The input circuit 100 includes an input line 102 for providing input regarding state of a load 104 connected to external ground 138. A first impedance 106 is connected to the input line 102 at a first node 108 for connecting a power or voltage source $V_{Power}$ to the input line 102. A second impedance 110 is connected to the input line 102 at a second node 112 for connecting the input line 102 to ground 114, which is an internal ground. A resistor or impendence 136 connects between internal ground 114 and an external ground 138 to provide an internal-external ground connection. A Zener diode 116 is connected in the input line 102 in series between the first and second nodes 108 and 112 with its cathode toward node 108 and its anode towards node 112. This impedes current flowing through the Zener diode 116 below the Zener voltage thereof in a direction from the first node 108 to the second node 112, and to allow current above the Zener voltage thereof in that same direction from first node 108 to second node 112.

A second diode 118 is connected in the input line 102 in series with the Zener diode 116 between the first and second nodes 108 and 112. The second diode 118 is oriented opposite the orientation of the Zener diode 116, i.e., the anode of the second diode 118 is toward first node 108 and the cathode of second diode 118 is toward second node 112. Second diode 118 impedes current flowing in the direction from the second node 112 to the first node 108 for lightning/transient protection. The second diode 118 is between the first node 108 and the Zener diode 116. The second diode 118 is a non-Zener diode. A load diode 120 is connected on the input line 102 on a side of the first node 108 opposite the second node 112 for protecting the input line 102 from transients from the load 104 that connects to an input node 122 of the input line 102 opposite the load diode 120 from the first node 108. The anode of the load diode 120 is toward the first node 108, and the cathode of the load diode 108 is toward the input node 122. The load diode 120 can be a non-Zener diode.

A clamp line 124 is connected to the input line 102 at the second node 112 for connecting a voltage outlet $V_{Logic}$ for relieving over voltage of the logic device 128. A clamp line diode 126 is connected in the clamp line 124 oriented with its anode towards the voltage outlet and its cathode towards second node 112 to impede current from the clamp line 124 into the input line 102 to ensure input voltage does not exceed an over voltage limit for the logic device 128 connected to the second node 112 of the input line.

To modify the input circuit 100 from a ground open input mode to a voltage open input mode, the circled portion of FIG. 1 can be added. A load line 130 is connected to the input line 102 at the input node 122 on a side of the first node 108 opposite the second node 112 for connecting the load 104 to the input line 102. A third impedance 134 can be connected to the input line 102 at input node 122 for providing the voltage open input from the input line 102 to the logic device 128, wherein the third impedance 134 connects between the input line 102 and ground 114. This provides a logic high to logic device 128 when there is a voltage powered on at the load node 122, and a logic low when the voltage is not powered on at the load node 122, wherein the Zener diode 116 provides the same clipping function described above with respect to the ground open input mode. Impedances such as impedances 106, 110, and 134 can be resistors or other types of impedance, such as those that allow for filtering.

The logic device 128 is operatively is connected to the second node 112 of the input line 102 for receiving open or voltage input as a logic high from the input line 102 and for receiving ground, voltage, or open input as a logic low from the input line 102. The logic device has a logic high voltage or requirement that is matched, or derived from, to the Zener voltage of the Zener diode 116. In this mode, namely open or voltage input mode, the portion of input circuit 100 that is circled in FIG. 1 is omitted. The Zener diode 116 clips voltages below its Zener voltage to ensure a voltage low is input to the logic device 128, for example when the ground is not open to the load 104, even when the voltage source $V_{Power}$ is at its highest voltage over its range of operation, e.g. at up to 28-volts or more. The Zener diode 116 also ensures that voltages above its Zener voltage are input as a logic high over the range of operation of $V_{Power}$.

A method of providing input from a load to a logic device includes impeding current through an input line, e.g. input line 102, to a logic device, e.g., logic device 128, with a Zener diode, e.g. Zener diode 116, to ensure a logic low is input to the logic device when voltage across the Zener diode is below the Zener voltage of the Zener diode. The method also includes allowing current through the input line to ensure a logic high is input to the logic device when voltage across the Zener diode exceeds the Zener voltage of the Zener diode. The method can include protecting the input line from transients with a diode, e.g., diode 118, in the input line oriented to oppose current in a direction from the logic device into the input line. Impeding the current and allowing current can include providing ground open input to the logic device for determining whether a load is grounded or not, e.g. by omitting the circled portion of FIG. 1. It is also contemplated that impeding the current and allowing current can include providing voltage open input to the logic device to determine whether a voltage source is powered on or not, e.g. by including the circled portion of FIG. 1.

Topologies disclosed herein allow circuits to operate with a wide range of input voltages and/or resistances where the Zener voltage dictates where the transition between logic high and low takes place. The Zener diode allows for fewer components to be used in a circuit since the conventional middle resistor is traditionally implemented as several components for lighting strike survivability. The topologies disclosed herein also provide a diode for blocking negative lighting strikes and/or transients, thus lower resistances can be used on the resistance to ground. Topologies as disclosed herein are also more suitable than conventional topologies for conversion into stand-alone integrated circuits for physical area reduction applications.

The methods and systems of the present disclosure, as described above and shown in the drawings, provide for improved ground/voltage open inputs with superior properties including the potential benefits as described above. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An input circuit comprising:
    an input line for providing input regarding state of a load;
    a first impedance connected to the input line at a first node for connecting a voltage source to the input line;
    a second impedance connected to the input line at a second node for connecting the input line to ground;
    a Zener diode connected in the input line in series between the first and second nodes to impede current flowing through the Zener diode below the Zener voltage thereof in a direction from the first node to the second node, and to allow current above the Zener voltage thereof in the direction from the first node to the second node;

a load line connected to the input line at an input node on a side of the first node opposite the second node for connecting a load to the input line; and a third impedance connected to the input line at the input node for providing voltage open input from the input line to a logic device connected to the second node of the input line.

2. The circuit as recited in claim 1, further comprising a second diode connected in the input line in series with the Zener diode between the first and second nodes, wherein the second diode is oriented to impede current flowing in the direction from the second node to the first node for lightning/transient protection.

3. The circuit as recited in claim 2, wherein the second diode is between the first node and the Zener diode.

4. The circuit as recited in claim 2, wherein the second diode is a non-Zener diode.

5. The circuit as recited in claim 1, further comprising a load diode connected on the input line on a side of the first node opposite the second node for protecting the input line from transients from a load connected to an input node of the input line opposite the load diode from the first node.

6. The circuit as recited in claim 1, further comprising a clamp line connected to the input line at the second node for connecting a voltage outlet for relieving over voltage of a logic device, wherein a clamp line diode is connected in the clamp line oriented to impede current from the clamp line into the input line to ensure input voltage does not exceed an over voltage limit for a logic device connected to the second node of the input line.

7. The circuit as recited in claim 6, wherein the logic device has a logic high voltage that is matched to the Zener voltage of the Zener diode.

8. The circuit as recited in claim 1, further comprising a logic device operatively connected to the second node of the input line for receiving voltage or open input as a logic high from the input line and for receiving open, ground, or voltage input as a logic low from the input line.

9. The circuit as recited in claim 1, further comprising:
a non-Zener diode connected in the input line in series with the Zener diode between the first node and the Zener diode, wherein the second diode is oriented to impede current flowing in the direction from the second node to the first node for lightning/transient protection;

a load diode connected on the input line on a side of the first node opposite the second node for protecting the input line from transients from a load connected to the input line;

a clamp line connected to the input line at the second node for connecting a voltage source for a logic device connected to the input line, wherein a clamp line diode is connected in the clamp line oriented to impede current from the clamp line into the input line to ensure input voltage does not exceed an over voltage limit for a logic device connected to the input line; and a logic device operatively connected to the input line at the second node for receiving voltage or open input as a logic high from the input line and for receiving open, ground, or voltage input as a logic low from the input line, wherein the logic device has a logic high voltage that is matched to the Zener voltage of the Zener diode.

10. The circuit as recited in claim 1, wherein the third impedance connects between the input line and ground.

11. A method of providing input from a load to a logic device comprising:
impeding current through an input line to a logic device with a Zener diode to ensure a logic low is input to the logic device when voltage across the Zener diode is below the Zener voltage of the Zener diode; and allowing current through the input line to ensure a logic high is input to the logic device when voltage across the Zener diode exceeds the Zener voltage of the Zener diode, wherein impeding the current and allowing current include providing voltage open input to the logic device to determine whether a voltage source is powered on or not.

12. The method as recited in claim 11, further comprising protecting the input line from transients with a diode in the input line oriented to oppose current in a direction from the logic device into the input line.

13. The method as recited in claim 11, wherein impeding the current and allowing current include providing voltage or open input to the logic device for determining whether a load is grounded or not.

* * * * *